United States Patent
Khouri et al.

(10) Patent No.: US 7,593,247 B2
(45) Date of Patent: Sep. 22, 2009

(54) ELECTRONIC MEMORY DEVICE HAVING HIGH INTEGRATION DENSITY NON-VOLATILE MEMORY CELLS AND A REDUCED CAPACITIVE COUPLING

(76) Inventors: Osama Khouri, Via Vespri Siciliani, 1, I-20146 Milano (IT); Carlo Caimi, Via Diaz, 13, I-20092 Cinisello Balsamo (MI) (IT); Giovanni Mastrodomenico, Via A. Banfi, 6, I-20059 Vimercate (MI) (IT)

( * ) Notice: Subject to any disclaimer, the term of this patent is extended or adjusted under 35 U.S.C. 154(b) by 0 days.

(21) Appl. No.: 11/300,145

(22) Filed: Dec. 14, 2005

(65) Prior Publication Data
US 2006/0158934 A1 Jul. 20, 2006

(30) Foreign Application Priority Data
Dec. 14, 2004 (IT) .......................... MI2004A2374

(51) Int. Cl.
*G11C 7/02* (2006.01)
(52) U.S. Cl. ................ 365/53; 365/185.17; 365/185.01
(58) Field of Classification Search ............ 365/185.17, 365/185.01, 185.14, 185.05, 53
See application file for complete search history.

(56) References Cited

U.S. PATENT DOCUMENTS

| 5,656,837 | A | | 8/1997 | Lancaster et al. ............ 257/314 |
|---|---|---|---|---|
| 5,877,980 | A | * | 3/1999 | Mang et al. ............ 365/185.17 |
| 5,917,365 | A | * | 6/1999 | Houston ..................... 327/534 |
| 5,936,887 | A | * | 8/1999 | Choi et al. ............. 365/185.17 |
| 7,045,854 | B2 | * | 5/2006 | Osabe et al. ................. 257/317 |
| 2003/0210582 | A1 | | 11/2003 | Kinoshita ................... 365/200 |
| 2004/0190333 | A1 | * | 9/2004 | Yuan et al. ................... 365/154 |
| 2004/0232496 | A1 | | 11/2004 | Chen et al. .................. 257/390 |
| 2009/0090965 | A1 | * | 4/2009 | Kito et al. .................... 257/326 |

* cited by examiner

*Primary Examiner*—Vu A Le
*Assistant Examiner*—Han Yang
(74) *Attorney, Agent, or Firm*—Trop, Pruner & Hu, P.C.

(57) ABSTRACT

A flash NAND electronic memory device includes non-volatile cells having a high integration density and a relative programming method. The memory device is integrated on a semiconductor substrate and includes a matrix with word lines and bit lines organized in sectors of memory cells. The memory device is between the cells of the opposite word lines belonging to at least one of the sectors of the matrix. A lateral coating along the direction of the bit lines has at least one conductive layer with a contact terminal being selectively biased or left floating during each program, read or erase operation. Each cell belongs to a sector.

11 Claims, 7 Drawing Sheets

|  | VBLselect | VBLunselect | VWselect | VWLunselect | Vwell | VSHIELD |
|---|---|---|---|---|---|---|
| PROGRAM | 0V | Vcc | 18V | 10V | 0V | V1 (0-20 V) |
| READ | Vcc(*) | Vcc | 0V | 4.5V | 0V | V1 (VDD, 0-4.5 V) |
| ERASE(#) | FLOAT | FLOAT | 0V | FLOAT | 20V | V2 (0 TO (-20) V) |

ELECTRONIC MEMORY DEVICE HAVING HIGH INTEGRATION DENSITY NON-VOLATILE MEMORY CELLS AND A REDUCED CAPACITIVE COUPLING

FIELD OF THE INVENTION

The present invention relates to an electronic memory device comprising high density non-volatile memory cells, and with a reduced capacitive coupling interference between the memory cells.

More specifically, the electronic memory device is integrated on a semiconductor substrate, of the type comprising a matrix of non-volatile memory cells organized in sectors. The non-volatile memory cells may be of the Flash NAND type, and the following description is made with reference to this field of application by way of illustration only.

BACKGROUND OF THE INVENTION

Electronic memory devices comprising non-volatile cells are largely used in multiple apparatuses where storing a great amount of information in a compact support is required, such as in cell phones, digital cameras and notebooks, for example.

In recent years, the circuit architecture of memory devices with non-volatile cells, combined with advanced technological processes, have resulted in the operational characteristics of the devices to be improved in terms of the write, read and erase speeds of the single memory cells.

The straightforward and reduced structure of the cells of the NAND type is suitable for realizing memory devices of the Flash NAND type having a high integration density. Memory devices with Flash NAND cells are semiconductor integrated devices, and comprise a plurality of memory cells that are organized in a matrix. The matrix of memory cells are organized in rows called word lines WL and columns called bit lines BL.

The particular matrix-like configuration of these non-volatile memory devices is key to obtaining the desired technical characteristics. The memory cells are floating gate transistors and they have a region of conductive material, insulated by a dielectric oxide, above which a control gate is overlapped. Everything is arranged above a channel region of the transistor.

According, for example, to a NAND architecture, the memory cells are arranged in series or strings and thus the sole contacts for a series of cells belong to the same bit lines, which are normally 16 or 32 cells. The contacts are on the drain of the drain select transistor DSL and on the source of the source select transistor SSL. Along the series the drain of the n-th cell is physically connected (same diffusion) to the source of the cell preceding it (n−1). The source of the cell (n) is in common with the drain of the successive cell (n+1). Thus, the drain and source electrodes of the single cells are not singularly accessible. Through metal electrodes connected to a body of each cell, predetermined voltage values are applied to the memory cell making it operative.

The charge stored in the floating gate region determines the logic state of the cell, modifying its threshold voltage. The fundamental characteristic of a memory cell is that of having two states, one with a low threshold voltage which, according to the convention, is given the value 0 or 1, and one with a high threshold voltage is given the is given the value 1 or 0. The voltage is externally applied through the control gate.

The need of storing, in a more reduced space, a greater amount of data has led to the development of devices with multilevel memory cells where, in each cell, different logic states are stored.

The high integration required for memory devices and thus the reduced space between the floating gates of opposite cells, arranged on consecutive word lines, makes it a fundamental importance for the accurate control of the distributions of the thresholds in the single cells so as to correctly position the cell at the programmed voltage value. In the devices with multi-level memory cells, the control of the thresholds in the single cells is even more important since the different levels are separated-within narrow voltage ranges.

Figure 1:
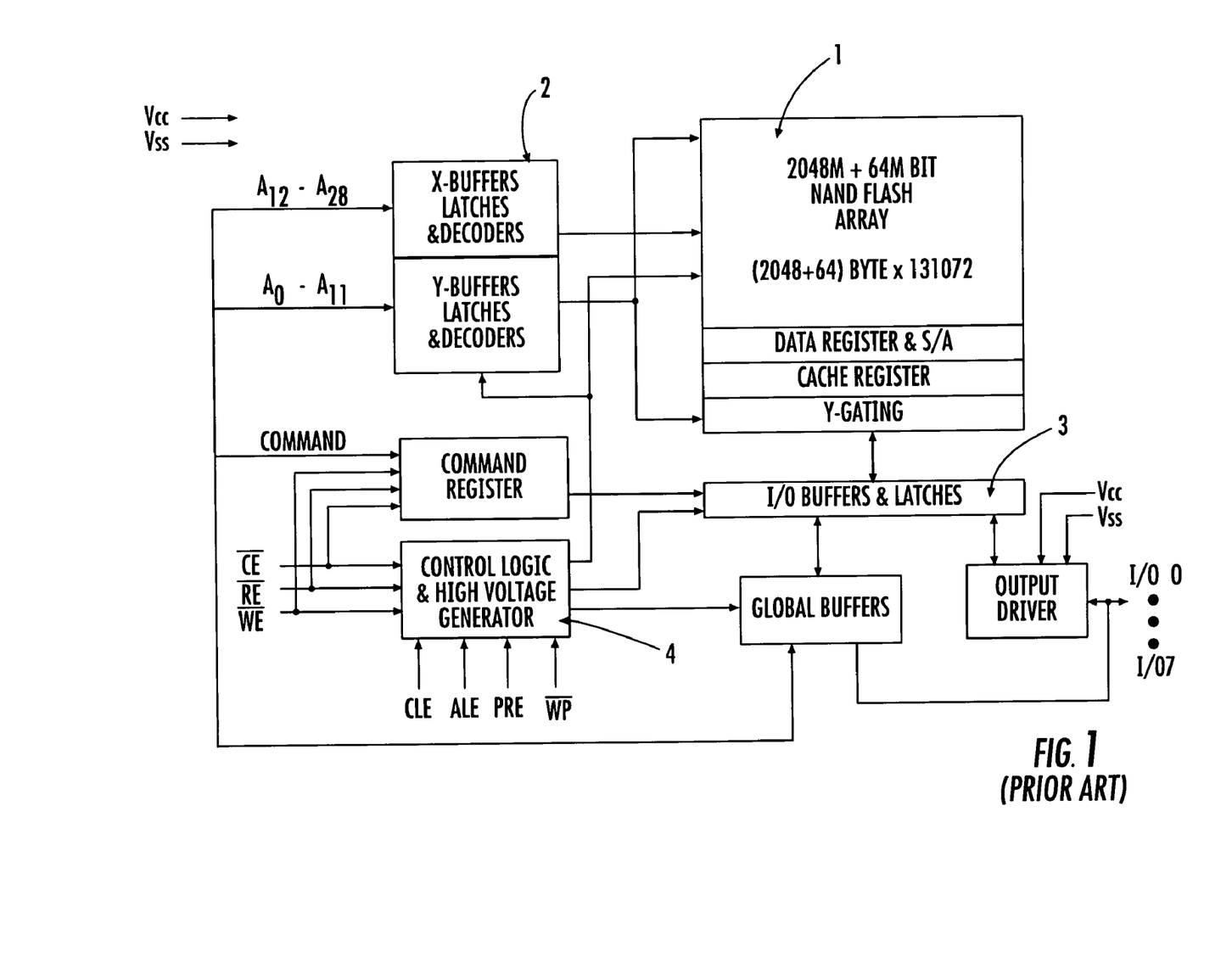
FIG. 1 schematically shows a circuit comprising a Flash NAND memory device according to the prior art.

The architecture of a Flash NAND memory includes, as highlighted in FIG. 1, an array 1 or matrix, a row and column decoder 2, a page buffer 3, a microcontroller 4 or other logic circuits such as control logics or state machines, and analog and digital circuits.

Figure 2:
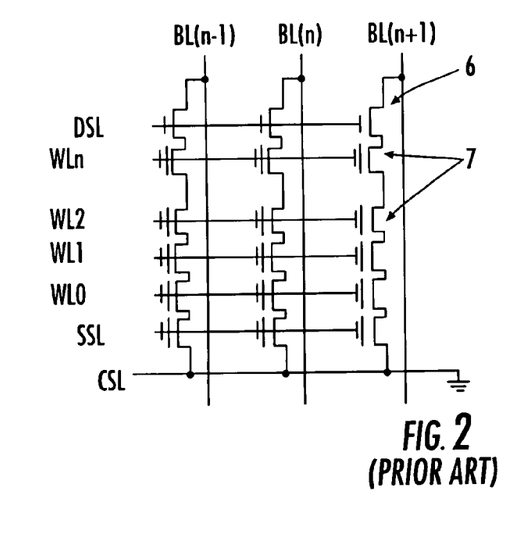
FIG. 2 shows an architecture of the base elements which form an array or matrix according to the prior art.

The architecture of the elements forming the array 1 is highlighted in FIG. 2. The base element of the array is a series or string 6 of cells 7 connected to a definite bit line BLn, and is between a drain selector DSL and a source selector SSL. The string can contain, for example, 16 or 32 cells 7 in series.

The group of cells between the two drain and source select transistors DSL and SSL, and belonging to all the bit lines BLs, with s between 1 and n, of the matrix define a sector or block. The cells 7 of the same sector or block share, according to the architecture, 16 or 32 word lines WL. The group of the sectors or blocks defines the array 1 or matrix.

The biases of the word lines WL, the bit lines BL and the well or body terminal in the single sectors of the matrix differ according to the operation to be performed in each cell: programming, reading or erasing. The programming and the erasing of the Flash NAND memory devices occur by a procedure called Flowler-Nordheim tunneling.

Figure 3:
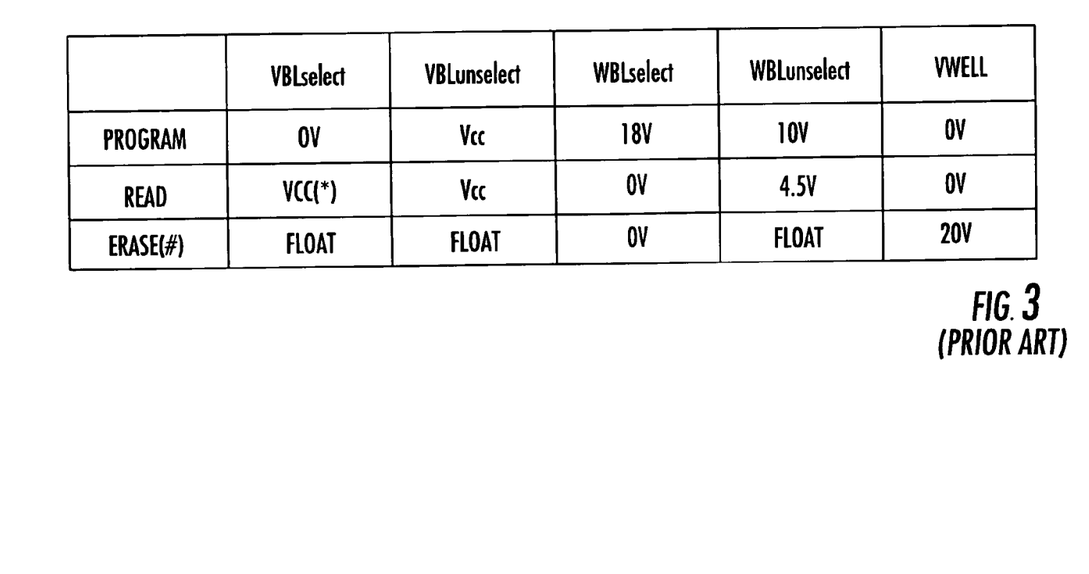
FIG. 3 shows a table reporting some biasing values according to a programming method known for a cell of the array of FIG. 2.

In a programming operation of a memory cell, a known method, indicated by way of example in the table of FIG. 3, provides 0V at the bit line BL of the cell to be programmed, 0V at the body of the cell to be programmed Vwell=0V to suitably enhance the voltage of the cell gate, i.e., of the-selected word line leading it for example to a value equal to 18V, with respect to 10V to which the non-selected word lines of the same selected block are brought.

The logic state of the other cells belonging to the same sector of the cell to be programmed, but not involved in the programming, is kept unaltered by inhibiting the corresponding bit lines, i.e., keeping them at a voltage value equal to VBL=Vcc. This causes a boosting effect in the channels of the non-selected cells, in which the VWLunselected=Vprogram voltage is about 20V in the example.

The read operation of a memory cell, i.e., interpreting the information contained in the cell, occurs through the conductivity or non-conductivity of the cell itself. The method places the voltage of the bit line to be read at a pre-charge value which, in this case, is for example Vcc, with VBLselect=Vcc. The voltage value of the other bit lines VBLunselect is 0V, the voltage value of the selected word line VWLselect is 0V, the value of the other word lines VWLunselect is for example 4.5V, and the value of the body voltage Vwell is 0V.

An erase operation for Flash NAND memory devices has the advantage that it can be carried out by block or sector. In this case the method places the voltage of all the floating bit lines VBLselect=VBLunselect=Vfloat, the voltage of the selected word line at 0V, VWLselect at 0V, the voltage of the other word lines VWLunselect at Vfloat and the body voltage Vwell for example at 20V.

During the programming of a cell in a memory device a lot of attention has been paid to the presence of disturbances, which can both influence the voltage value stored in the single cell to be programmed, and cause a variation of the voltages stored in the adjacent cells.

In the devices with non-volatile memory cells the undesired capacitive couplings between the cells are among the main factors responsible for the disturbances and the so-called "widening of the distributions". In multilevel devices "the widening of the disturbances" is more dangerous since the thresholds relative to the different levels or logic states are separated within narrow voltage ranges.

Figure 7:
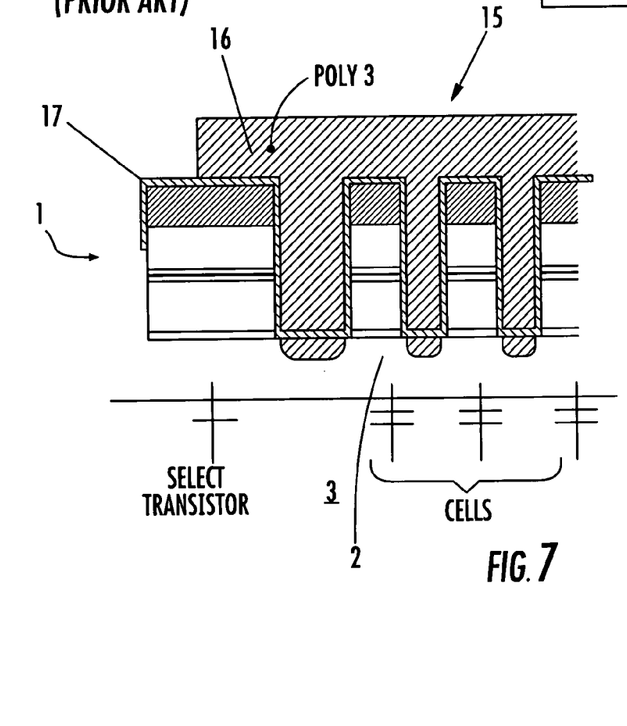
FIG. 7 shows an exemplary scheme of a device according to the present invention.
Figure 8:
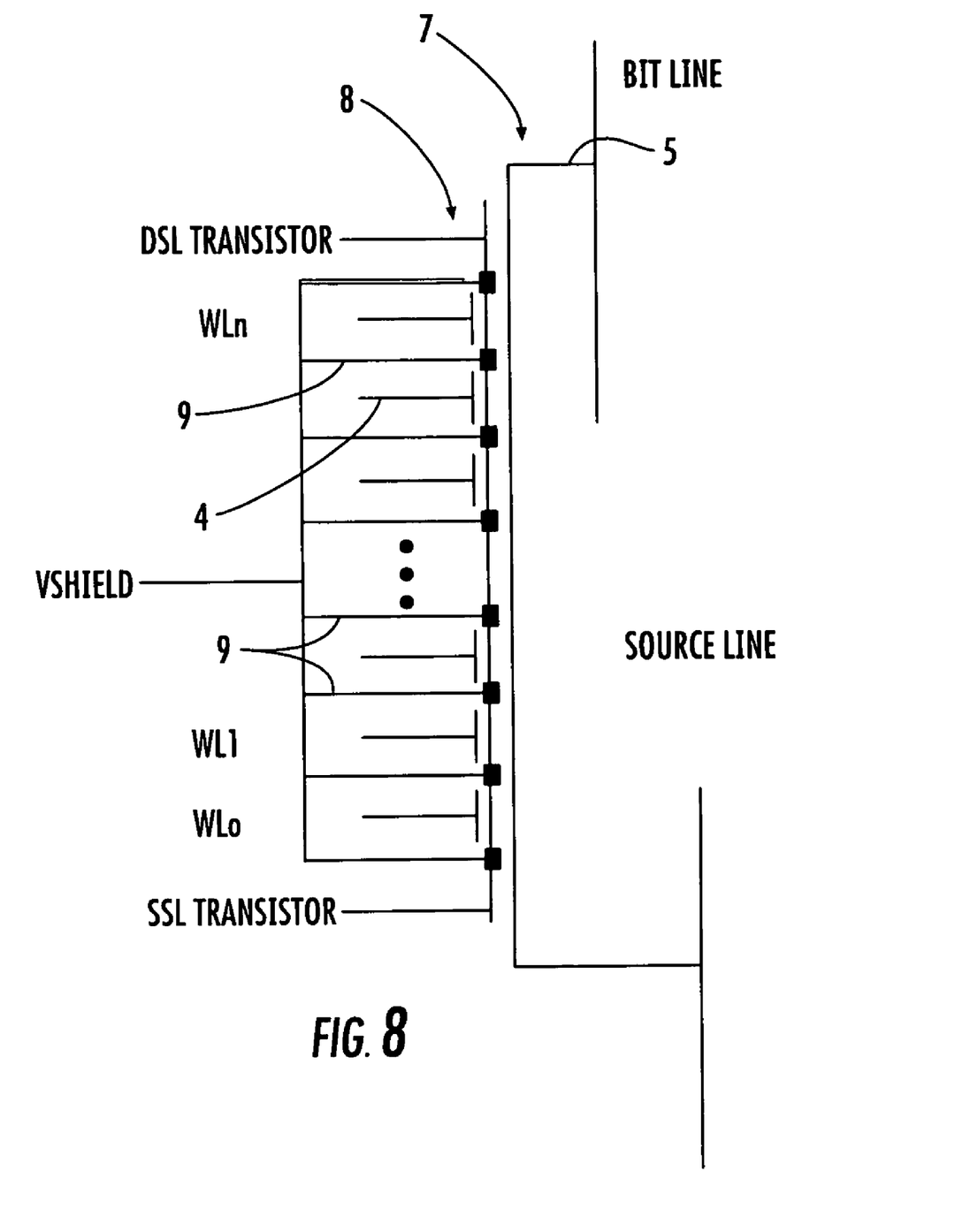
FIGS. 8 and 9 respectively show an architecture of a Flash NAND memory device, and an example of a possible circuit scheme according to the present invention.

In a memory of the Flash NAND type, with a high density, the main parasitic capacitive components are identified, with reference to FIGS. 7 and 8, with the capacitances along:

1. the direction Y of the bit lines;
2. the direction X of the word lines; and
3. direction XY diagonal couplings.

The three identified parasitic capacitances take different values from each other and typically, in the order indicated, they have decreasing values.

The presence of these parasitic capacitances creates serious problems. In fact, they tend to modify the voltages in the cells, and in particular, during the programming operation.

Figure 4:
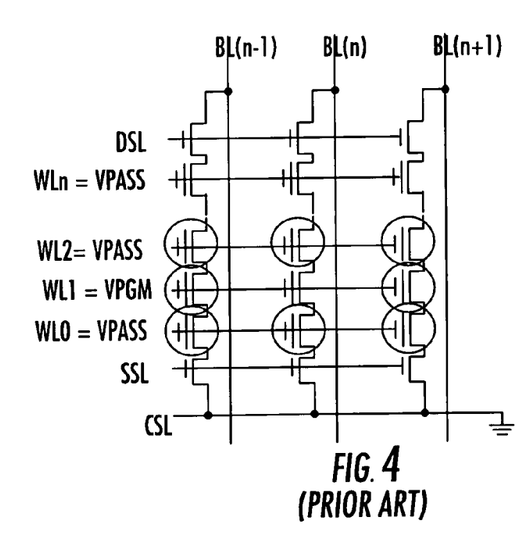
FIG. 4 shows a device with nine cells with indications of the voltages of the cells during the programming of the central cell according to the method reported in FIG. 3.
Figure 5:
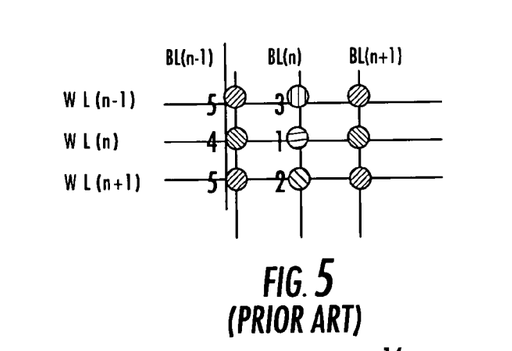
FIG. 5 shows an exemplary scheme of a device comprising nine cells identified by word lines and bit lines according to the prior art.

With particular reference to FIG. 4, during the programming of the centrally arranged cell the floating gate voltage of this cell can, as an effect of the parasitic capacitances which are formed with the floating gates of the adjacent cells, be modified. The presence of the parasitic capacitances is due to the geometry of the cells, to the lithography and to the presence of the dielectric placed between the opposite word lines. This is in combination with the limited distance from one another due to the high integration degree of the cells in these devices.

Figure 6:
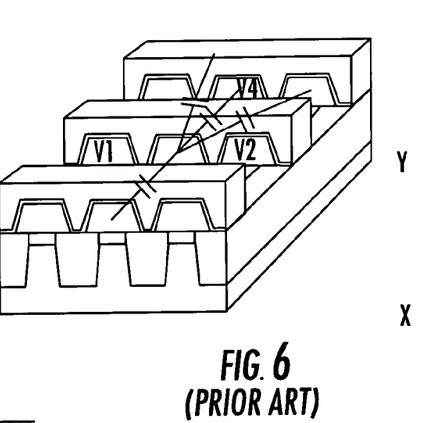
FIG. 6 shows a perspective view of a device according to the prior art.

A summary scheme of the parasitic capacitances present in a device is indicated in FIG. 6. From suitable measurements it has been possible to observe how the total of the voltage variation Vth of a cell, due to all the parasitic capacitances of the surrounding cells, erased with voltage for example equal to 20V and programmed with method ISPP, i.e., with the same values of $\Delta V_{step}$=0.5V and $t_{step}$=20 μs, is about 500 mV. The main part of the voltage variation Vth of a cell is mainly due to the contribution of the capacitive couplings along the bit lines, i.e., along the direction Y.

This confirms how the value of the parasitic capacitances, which are created along the bit lines, significantly influences the threshold voltage of the single cells, and thus the correctness of the programmable and programmed values.

SUMMARY OF THE INVENTION

An object of the present invention is to provide a device of non-volatile memory cells of the Flash NAND type, matrix-like organized and comprising one or more sectors, having such structural and functional characteristics as to allow a reduction in the capacitive coupling between floating gates regions belonging to opposite cells placed on consecutive word lines. This allows the carrying out of a reliable programming also in high integration devices, thus overcoming the drawbacks indicated in the devices realized according to the prior art.

This and other objects, advantages and features in accordance with the present invention are provided by a floating conductive shield interposed between the rows or word lines of the sectors of the matrix of the memory device.

One aspect of the present invention is directed to an electronic memory device comprising a semiconductor substrate, a plurality of non-volatile memory cells integrated on the semiconductor substrate and organized in a matrix of rows and columns. The matrix of memory cells may be divided into a plurality of sectors. A plurality of word lines is connected to the rows of the matrix, and a plurality of bit lines is connected to the columns of the matrix. A coating may be between memory cells of opposite word lines belonging to at least one of the plurality of sectors of the matrix. The coating may comprise at least one conductive layer, and at least one contact terminal connected thereto to selectively apply a biasing potential during at least one of program, read and erase operations of the plurality of memory cells.

Another aspect of the present invention is directed to a method for programming an electronic memory device as defined above. The method comprises selectively applying a biasing potential having a first biasing voltage to the at least one contact terminal during program and read operations of the plurality of memory cells, and a second biasing voltage during erase operations of the plurality of memory cells.

BRIEF DESCRIPTION OF THE DRAWINGS

The characteristics and the advantages of the device and of the method according to the invention will be apparent from the following description of an embodiment thereof given by way of a non-limiting example with reference to the annexed drawings. In these drawings.

DETAILED DESCRIPTION OF THE PREFERRED EMBODIMENTS

With reference to FIG. 7, a portion 1 of a Flash NAND memory electronic device is integrated on a semiconductor substrate 3, of the type comprising a matrix 6 of non-volatile Flash NAND memory cells 2.

Figure 11:
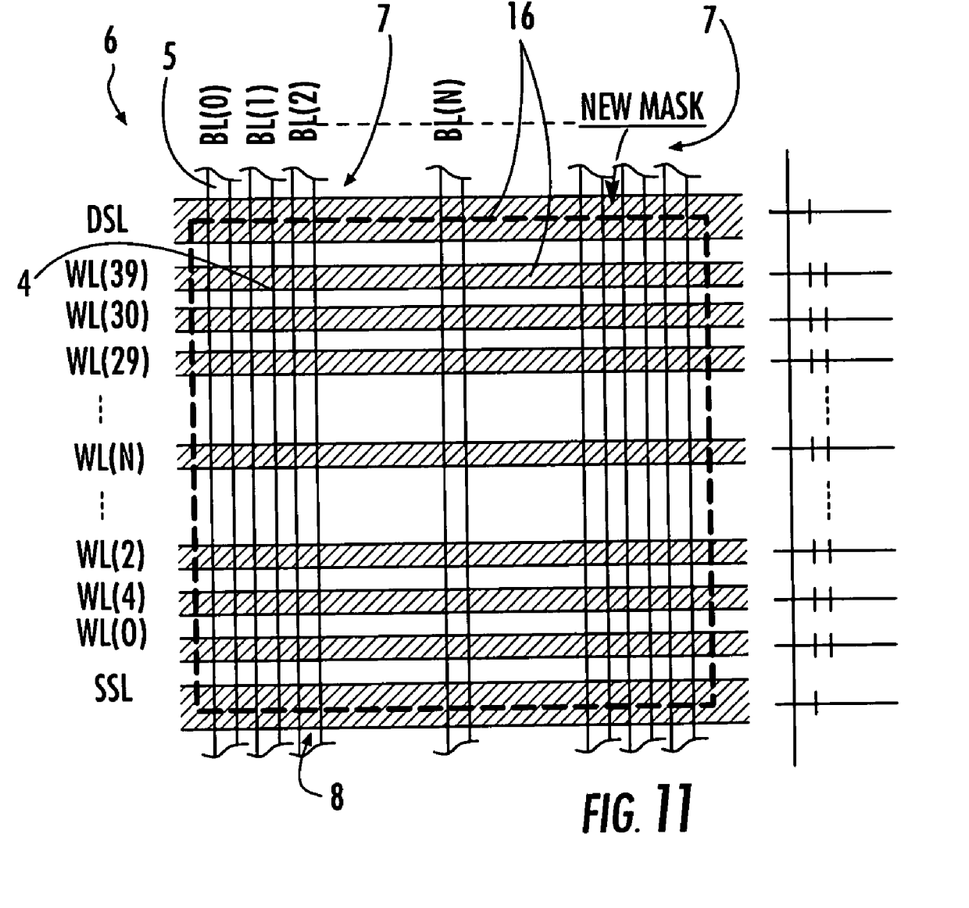
FIG. 11 shows a schematic view from above of a memory cell matrix according to the present invention.

The matrix 6 of the memory device 1, highlighted in FIG. 11, is organized in one or more sectors 7 comprising rows or word lines 4 and columns or bit lines 5 of memory cells 2. Each sector 7 or block comprises n strings 8, where n is the number of the bit lines 5 defining the electronic device 1.

According to a current architecture, each string 8 has 16 or 32 non-volatile memory cells 2, all being connected to a same bit line 5 through a drain select transistor DSL and a source select transistor SSL.

The group of cells 2 between the two select transistors DSL and SSL belong to all the bit lines BL of the string 8 of the matrix 6 to define the sector 7 or block.

Advantageously, according to the present invention, as highlighted in FIG. 7, above the substrate 3 and between opposite word lines 4, i.e., between a WLn−1 and a successive one WLn, a lateral coating 15 is provided comprising at least one conductive layer 16. Suitably, the conductive layer 16 has a conformation laterally shaped on the cells 2 along the direction of the bit lines 5.

Advantageously, according to the present embodiment, the coating 15 also comprises a thin insulating layer 17 arranged below the conductive layer 16 which insulates the cells 2, and in particular the respective floating gates from the conductive layer 16.

In the case of a memory device 1 with cells 2 comprising lateral spacers placed along the direction of the bit lines 5, the insulating layer 17 will not be present.

The conductive layer 16 of the coating 15 defines at least between the opposite word lines 4 on each sector 7 of the matrix 6, a conductive shield which, by way of a contact terminal 9 is suitably biased, as shown in FIG. 8.

The conductive layer 16 biased by the contact terminal 9 allows the effect of the capacitive coupling which would be created along the string 8 during the programming operation to be minimized and/or eliminated.

Further, the conductive layer 16 during the various program, read or erase operations of each sector 7 of the matrix 6 takes a different biasing value. This value, suitably programmed, allows the performance of the single factor 7 to be optimized, thus reducing noise during the single operations.

Figure 9:
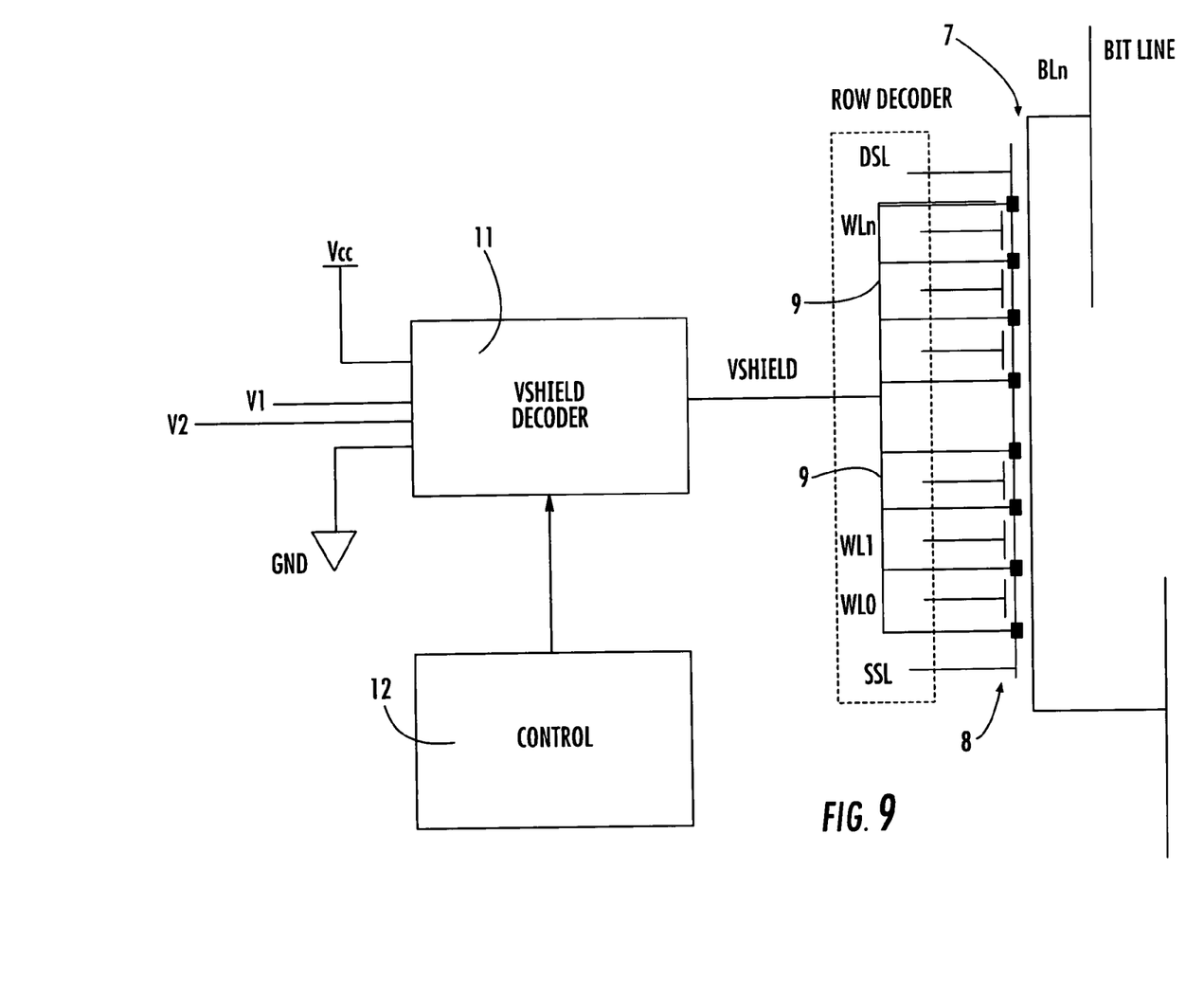

In particular, as shown in FIGS. 8, 9 and 11, the conductive layers 16 of a same sector 7 have the contact terminals 9 connected to each other and placed simultaneously at a value equal to Vshield. The conductive layer 16 of a same sector 7 is thus equi-potential. The Vshield value and thus the voltage value of the contact terminal 9 is set by a decoder 11 which is in turn regulated by a control unit 12 or microcontroller. The control unit 12 defines the voltage of the conductive layer 16.

In FIG. 9 the decoder takes in input four different values, which are a supply voltage Vcc, a ground voltage gnd and two further voltage values V1 and V2, different with respect to the previous ones.

According to the typology of the memory device 1, if with two levels or multilevel, the input values of the decoder 11 can be of a different number and they can take different values. Moreover, each value can be suitably generated by possible blocks placed upstream of the decoder 11.

A method defines the voltage values to be applied to the contact terminal 9 of a sector 7 of the matrix 6 during the program, read and erase operations of each cell 2 contained in the sector 7 so as to eliminate the parasitic capacitances. The voltage values to be applied to the contact terminal 9 are reported in the table of FIG. 10.

Figure 10:
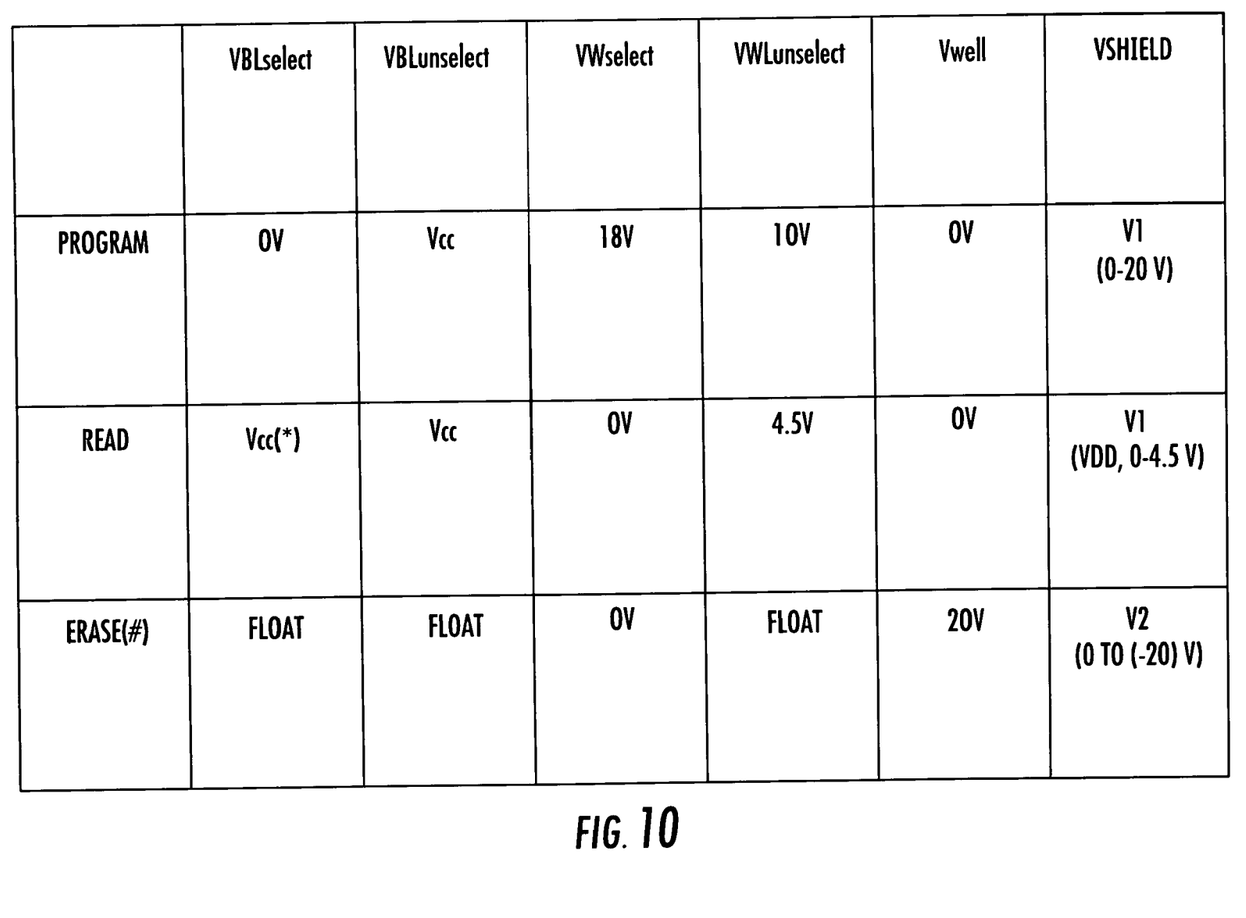
FIG. 10 shows a table comprising some examples of biasing of a Flash NAND memory device according to a method of the present invention.

In particular, during a program operation of a cell 2, the contact terminal 9 of the conductive layer 16 is placed at a voltage between 0V and 20V, for example 10V. In this way the conductive layer 16 of the whole sector 7 will be biased, thus avoiding the formation of parasitic capacitances between the floating gates of the cells 2 placed on opposite word lines 4.

For a read operation of a cell 2, the contact terminal 9 will be placed at a voltage equal to V1 which will take values of Vdd, or a value between 0V and 4.5V. During the read operation the whole conductive layer 16 of the sector 7 is equipotential and the current which will be absorbed during this operation will be exactly the one absorbed by the transistor of the selected cell 2 without the possibility of dispersion.

During the erase step the conductive layer 16 is placed at a voltage equal to V2 a value between 0V and −20V, preferably equal to about −10V. During the erase operation the body Vwell voltage is placed positive, and by placing the voltage of the conductive layer 16 negative, the erase operation on the whole sector 7 of the matrix 6 is significantly facilitated.

For example, by placing the value of V2, for example at −10V and the value of Vwell equal to +10V, the difference of potential is 20V and this favors the migration of the charges outside the sector 7 of the matrix 6.

The biasing of the conductive layer 16 can occur with different voltage values, specific according to the design needs. In particular, a biasing will be realized independently from the single sectors 7 of the same matrix 6 by setting voltages different from the respective contact terminals 9.

The present invention can be applied to devices with floating gate memory cells showing different embodiments, all however within the same scope of protection.

That which is claimed is:

1. An electronic memory device comprising:
   a semiconductor substrate;
   a plurality of non-volatile memory cells integrated on said semiconductor substrate and organized in a matrix of rows and columns, said matrix of memory cells being divided into a plurality of sectors;
   a plurality of word lines connected to the rows of said matrix;
   a plurality of bit lines connected to the columns of said matrix; and
   a coating between memory cells of opposite word lines belonging to at least one of said plurality of sectors of said matrix, said coating comprising spaced apart conductive layers and at least one contact terminal connected thereto to selectively apply a biasing potential during at least one operation of said plurality of memory cells.

2. An electronic memory device according to claim 1, wherein the at least one operation includes at least one of program, read and erase operations.

3. An electronic memory device according to claim 1, wherein said coating laterally extends on said memory cells along a direction of said plurality of bit lines.

4. An electronic memory device according to claim 1, wherein said coating comprises at least one insulating layer below said spaced apart conductive layers.

5. An electronic memory device according to claim 1, wherein said plurality of non-volatile memory cells are of a Flash NAND type.

6. An electronic memory device comprising:
   a semiconductor substrate;
   a plurality of non-volatile memory cells on said semiconductor substrate and organized in a matrix of rows and columns, said matrix of memory cells being divided into a plurality of sectors;
   a plurality of word lines connected to the rows of said matrix;
   a plurality of bit lines connected to the columns of said matrix;
   a coating between memory cells of opposite word lines belonging to at least one of said plurality of sectors of said matrix, said coating comprising spaced apart conductive layers and at least one contact terminal connected thereto; and a biasing device for selectively applying a first biasing voltage to said at least one contact terminal during program and read operations of said plurality of memory cells and a second biasing voltage to said at least one contact terminal during erase operations of said plurality of memory cells.

7. An electronic memory device according to claim 6, wherein said coating laterally extends on said memory cells along a direction of said plurality of bit lines.

8. An electronic memory device according to claim 6, wherein said coating comprises at least one insulating layer below said spaced apart conductive layers.

9. An electronic memory device according to claim 6, wherein the first biasing voltage is between 0V and 20V during the programming operation.

10. An electronic memory device according to claim 6, wherein the first biasing voltage is between 0V and 4.5V during the read operation.

11. An electronic memory device according to claim 6, wherein the second biasing voltage is v-e between 0V and −20V during the read operation.

* * * * *